US011170924B2

United States Patent
Cummings et al.

(10) Patent No.: US 11,170,924 B2
(45) Date of Patent: Nov. 9, 2021

(54) COMPUTING DEVICES, REMOVABLE SUPPORT DEVICES, AND METHODS OF USE

(71) Applicant: Microsoft Technology Licensing, LLC, Redmond, WA (US)

(72) Inventors: Stephan Alexander Cummings, Wilsonville, OR (US); Jan Raken, Seattle, WA (US); Srinivas Reddy Nagampet, Redmond, WA (US); Whitney David Seiberlich, Kent, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 94 days.

(21) Appl. No.: 15/909,689

(22) Filed: Mar. 1, 2018

(65) Prior Publication Data

US 2018/0254132 A1 Sep. 6, 2018

Related U.S. Application Data

(60) Provisional application No. 62/466,245, filed on Mar. 2, 2017.

(51) Int. Cl.
*H01F 7/02* (2006.01)
*G06F 1/16* (2006.01)
*H05K 7/18* (2006.01)

(52) U.S. Cl.
CPC ......... *H01F 7/0252* (2013.01); *G06F 1/1613* (2013.01); *G06F 1/1616* (2013.01);
(Continued)

(58) Field of Classification Search
CPC .... G06F 1/1613; G06F 1/1616; G06F 1/1626; G06F 1/1654; G06F 1/1679; H01F 7/0221; H01F 7/0252; H05K 7/186
See application file for complete search history.

(56) References Cited

U.S. PATENT DOCUMENTS 7,561,786 B1  7/2009  Black
8,073,324 B2  12/2011 Tsai
(Continued)

FOREIGN PATENT DOCUMENTS

WO  2014074102 A1  5/2014
WO  2016061662 A1  4/2016
WO  2016069652 A1  5/2016

OTHER PUBLICATIONS

Schmidt, et al., "Phones and MP3 Players as the Core Component in Future Appliances", In Proceedings of IEEE Pervasive computing, Apr. 2011, pp. 8-11.
(Continued)

*Primary Examiner* — Bernard Rojas
(74) *Attorney, Agent, or Firm* — Ray Quinney & Nebeker P.C.; Paul N. Taylor

(57) ABSTRACT

A computing device having an interface surface and one or more attachment features oriented on the interface surface is described. A removable support device with an interface surface and one or more attachment features oriented on the interface surface is described. A support system with a computing device and a removable support device is described. A method of using a support system is described.

20 Claims, 13 Drawing Sheets

(52) U.S. Cl.
CPC .......... *G06F 1/1626* (2013.01); *G06F 1/1654* (2013.01); *G06F 1/1679* (2013.01); *H01F 7/0221* (2013.01); *H05K 7/186* (2013.01)

(56) References Cited

U.S. PATENT DOCUMENTS

| | | | |
|---|---|---|---|
| 8,138,869 B1 | 3/2012 | Lauder et al. | |
| 8,344,836 B2 * | 1/2013 | Lauder | H01F 7/0205 335/219 |
| 8,405,479 B1 * | 3/2013 | Cleveland | H01F 7/0273 335/296 |
| 8,816,805 B2 * | 8/2014 | Fullerton | H01F 7/0215 335/284 |
| 8,972,617 B2 | 3/2015 | Hirschman | |
| 9,071,672 B2 | 6/2015 | Smith et al. | |
| 9,235,230 B1 | 1/2016 | Tarnow et al. | |
| 9,370,114 B1 | 6/2016 | Hulick et al. | |
| 2007/0133156 A1 * | 6/2007 | Ligtenberg | G06F 1/1679 361/679.27 |
| 2007/0138806 A1 * | 6/2007 | Ligtenberg | E05C 19/16 292/251.5 |
| 2008/0004003 A1 | 1/2008 | Wulff et al. | |
| 2008/0186683 A1 * | 8/2008 | Ligtenberg | G06F 1/1616 361/726 |
| 2010/0087071 A1 * | 4/2010 | DiFonzo | H01R 13/641 439/39 |
| 2011/0064401 A1 | 3/2011 | Desorbo | |
| 2011/0252607 A1 * | 10/2011 | Rothbaum | B65H 75/4473 24/303 |
| 2012/0007705 A1 * | 1/2012 | Fullerton | E05C 19/16 335/306 |
| 2012/0295451 A1 * | 11/2012 | Hyun-Jun | H01R 13/6205 439/39 |
| 2013/0304941 A1 | 11/2013 | Drasnin | |
| 2015/0316999 A1 * | 11/2015 | Harms | G06F 3/023 345/169 |
| 2016/0111815 A1 * | 4/2016 | Szeto | H01R 13/6205 439/39 |
| 2016/0111948 A1 * | 4/2016 | Sun | H01F 7/0278 310/12.21 |
| 2016/0361639 A1 | 12/2016 | Schmitz et al. | |
| 2018/0062688 A1 * | 3/2018 | Wang | A45C 11/00 |
| 2020/0282463 A1 * | 9/2020 | Fujikawa | H01F 13/003 |

OTHER PUBLICATIONS

"International Search Report & Written Opinion Issued in PCT Application No. PCT/US18/020689", dated Jun. 20, 2018, 11 Pages.

* cited by examiner

COMPUTING DEVICES, REMOVABLE SUPPORT DEVICES, AND METHODS OF USE

CROSS REFERENCE TO RELATED APPLICATIONS

This application claims the benefit of U.S. Provisional Patent Application No. 62/466,245, filed on Mar. 2, 2017, which is hereby incorporated by reference in its entirety.

BACKGROUND

Background and Relevant Art

Use of computing devices is becoming more ubiquitous by the day. Computing devices range from standard desktop computers to wearable computing technology and beyond. Laptops often connect the display to the keyboard along a shared edge using a friction hinge. However, with the advent of hybrid computers, the display and the keyboard may be connected and disconnected at will. Some computing devices, including hybrid computers, do not include a friction hinge along a shared edge between the display and the keyboard. Rather, the computing devices may include an integrated support device to position the display. It may be desirable to mount the display of a computing device to various removable support devices.

The subject matter claimed herein is not limited to implementations that solve any disadvantages or that operate only in environments such as those described above. Rather, this background is only provided to illustrate one exemplary technology area where some implementations described herein may be practiced.

BRIEF SUMMARY

In one implementation, a computing device is described. The computing device includes an interface surface and one or more attachment features oriented on the interface surface.

In one implementation, a removable support device is described. The removable support device includes an interface surface and one or more attachment features oriented on the interface surface.

In one implementation, a support system is described. The support system includes a computing device and a removable support device. The computing device includes an interface surface and one or more attachment features oriented on the interface surface of the computing device. The removable support device includes an interface surface and one or more attachment features oriented on the interface surface of the removable support device.

In one implementation, a method of using a support system is described. The method includes connecting a removable support device to a computing device.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims, or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which:

FIG. 5-1 is a perspective view of an implementation of an interface surface with one or more attachment features;

FIG. 5-2 is a side cross-sectional view of the implementation of an interface surface with one or more attachment features of FIG. 5-1;

FIG. 13-1 is a side view of an implementation of a support system in an open configuration;

FIG. 13-2 is a side view of the implementation of a support system of FIG. 13-1 in a closed configuration;

FIG. 14-1 is a perspective view of an implementation of a support system with a removable support device with a fixed geometry in a first position;

FIG. 14-2 is a side view of the implementation of a support system of FIG. 14-1 in the first position;

FIG. 14-3 is a side view of the implementation of a support system of FIG. 14-1 in a second position.

DETAILED DESCRIPTION

This disclosure generally relates to computing devices, removable support devices, support systems, and methods of use. More particularly, this disclosure generally relates to computing devices with one or more attachment features and/or removable support devices with one or more attachment features. In some implementations, a computing device may have an interface surface with one or more attachment features positioned therein. The one or more attachment features may allow the computing device to removably attach to a variety of support devices. For example, the support device may include a height-adjustable stand, similar to a desktop computer monitor. In other examples, the support device may be a handheld support device, such as a platen with a hand strap to aide in securely carrying the computing device.

In some implementations, the one or more attachment features of the computing device and one or more attachment features of the support device may be complementary to interact and attach the computing device to the support device. For example, the one or more attachment features of the computing device may include magnetic attachment features, and the one or more attachment features of the support device may include complementary magnetic attachment features that attract one another. In some implementations, the one or more attachment features of the computing device and one or more attachment features of the support device may be complementary to interact and attach the computing device to the support device at a predetermined orientation. For example, the one or more attachment features of the computing device may include magnetic attachment features with a polarity in-plane with the interface surface, and the one or more attachment features of the support device may include complementary magnetic attachment features with a polarity in-plane with the interface surface. The magnetic attachment features and complementary magnetic attachment features may apply a torque to one another based upon the relative orientation of the polarities to attach the computing device to the support device at a predetermined orientation.

Figure 1:
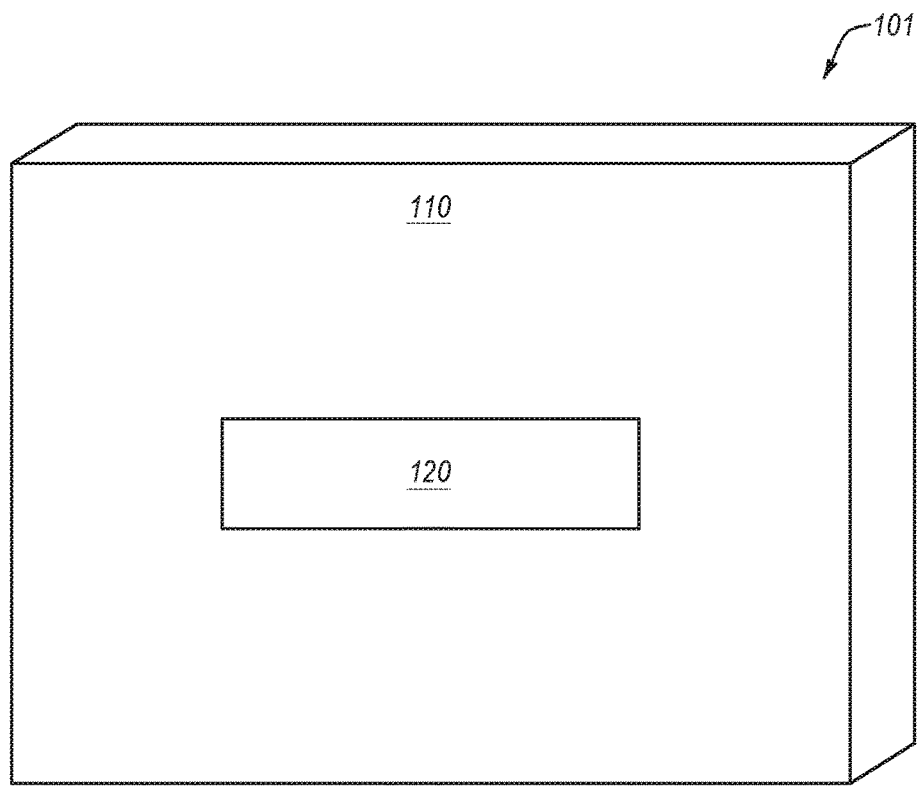
FIG. 1 is a perspective view of an implementation of a computing device.

FIG. 1 is a schematic perspective view of an implementation of a computing device 101. The computing device 101 may include a processor and memory (not shown). The computing device 101 may include a display and/or keyboard. The computing device 101 may include an interface surface 110. The interface surface 110 may include one or more attachment features 120. The computing device 101 is shown with a single interface surface 110 and a single attachment feature 120. In other implementations, more interface surfaces 110 and/or attachment features 120 may be used.

The one or more attachment features 120 may include one or more magnets, one or more mechanical interlock features, other attachment features, or combinations thereof. Mechanical interlock features may include one or more of a snap feature, a detent feature, a solenoid actuated lock feature, a shape memory alloy actuated lock feature, a self-locking taper feature, a compressible interference feature, a pressure sensitive adhesive, channels (one or more of a bottom channel, one or more side channels, one or more corner channels, and a top channel) into which the computing device 101 may slide to limit movement in at least one direction (e.g., toward the ground, out of plane, laterally), and micro-suction tape.

In some implementations, a magnetic attachment feature may include a permanent magnet or an electromagnet. In some examples, the magnetic attachment feature may include a variable strength electromagnet. In other examples, the magnetic attachment feature may include a rare-earth element (such as neodymium) permanent magnet. In at least one implementation a magnetic attachment feature may be a ferromagnetic material or other material that does not have a magnetic field itself, while still being attracted to a nearby magnetic attachment feature.

The computing device 101 may be attached to a support structure using the interface surface 110 with one or more attachment features 120. In the present implementation, the computing device 101 may include a display opposite the interface surface 110.

The interface surface 110 is shown as a flat planar surface. In further implementations, the interface surface 110 may be curved or otherwise shaped. In yet other implementations, the interface surface 110 may have a textured surface and/or surface features, such as grooves, ridges, sipes, recesses, bumps, pits, etc. that may engage or interact with an interface surface of the support device. The textured interface surface 110 and/or surface features may limit and/or prevent movement of the computing device 101 relative to the support device while in contact.

The interface surface 110 of the computing device 101 may be positioned adjacent a support device. For example, FIG. 2 is a schematic perspective view of an implementation of a removable support device 202.

The removable support device 202 includes an interface surface 230 and one or more attachment features 240. The interface surface 230 and/or one or more attachment features 240 may be the same as, similar to, or complementarily shaped to the interface surface 110 and/or one or more attachment features 120 of the computing device 101 of FIG. 1. For example, the interface surface 110 of the computing device 101 may be convex, and the interface surface 230 of the support device 202 may be concave to complementarily fit with the computing device 101. In other examples, the interface surface 110 of the computing device 101 may have a surface feature, and the interface surface 230 of the support device 202 may have a surface feature that complementarily fits with that of the computing device 101. In yet other examples, the attachment features 120 of the computing device 101 may include a magnetic attachment feature with a magnetic field polarization in the upward vertical direction relative to the orientation illustrated in FIG. 1, and the attachment features 240 of the support device 202 may include a magnetic attachment feature with a magnetic field polarization in the downward vertical direction relative to the orientation illustrated in FIG. 2 to complementarily fit with the computing device 101.

In some implementations, the removable support device 202 may include a power supply (not shown), one or more sensors, a processor, memory, other components, or combinations thereof. For example, the removable support device 202 may include a power supply to wireless charge or power the computing device. In other examples, the removable support device 202 may include a processor and/or memory to perform one or more tasks when a computing device 101 is attached to the removable support device 202. In yet other examples, the removable support device 202 may include one or more communication devices to allow data communication between the removable support device 202 and the computing device 101 when a computing device 101 is attached to the removable support device 202. In some embodiments, a cooling feature may also be included. For example, a fan, liquid cooling, or other cooling feature may be included in the removable support device 202.

Figure 2:
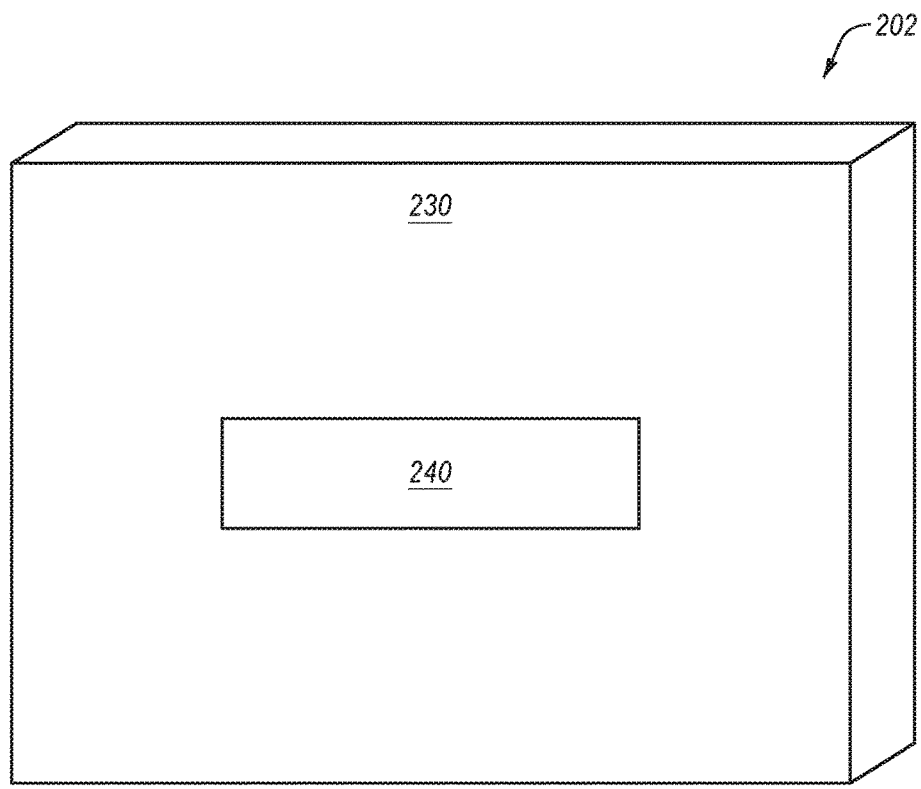
FIG. 2 is a perspective view of an implementation of a removable support device.
Figure 3:
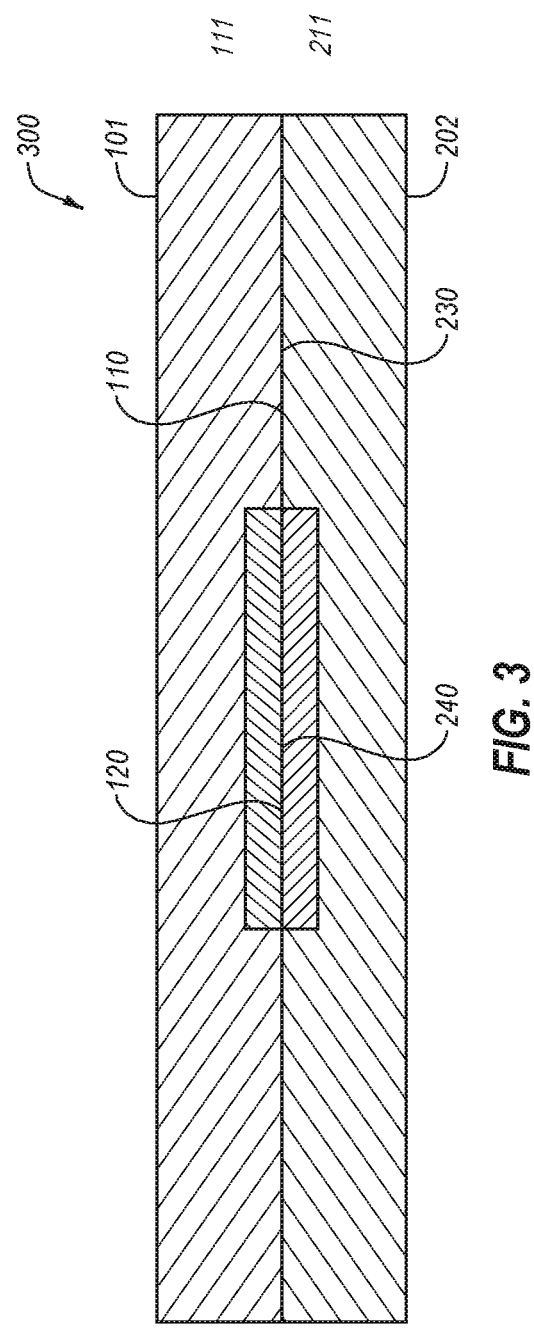
FIG. 3 is a side cross-sectional side view of the implementation of the computing device of FIG. 1 and the implementation of the removable support device of FIG. 2.

FIG. 3 is a side schematic cross-sectional side view of the implementation of a system 300 including the computing device 101 of FIG. 1 and the implementation of the removable support device 202 of FIG. 2 in an attached state. As shown, the interface surface 110 of the computing device 101 may be adjacent to the interface surface 230 of the removable support device 202. The interface surfaces 110, 230 of the computing device 101 and the removable support device 202 may abut in the connected state. In other implementations, a protective pad, liner, or other spacing member may hold at least a portion of the interface surfaces 110, 230 apart from one another to limit and/or prevent scratching or marring of the interface surfaces 110, 230 (e.g., to retain the aesthetics of the computing device 101 and/or removable support device 202). For example, the interface surfaces 110, 230 may be spaced apart by up to 0.25 mm, up to 0.50 mm, up to 0.75 mm, up to 1.0 mm, or greater than 1.0 mm and be considered in an attached state.

One or more of the attachment features 120 of the computing device 101 and or more of the attachment features 240 of the removable support device 202 may abut in the connected state. In other implementations, the one or more attachment features 120, 240 may not abut in the connected state. For example, one or more of the attachment features 120 of the computing device 101 and one or more of the attachment features 240 of the removable support device 202 may be spaced apart by up to 0.25 mm, up to 0.50 mm, up to 0.75 mm, up to 1.0 mm, or greater than 1.0 mm and be considered in an attached state.

In some implementations, a communication device 111, 211 of the computing device 101 and/or the removable support device 202 may be an active communication device, such as BLUETOOTH, Near-Field Communication (NFC), WIFI, or radio transmission, or other communication devices or mechanisms that may transmit and receive data. For example, an active communication device may allow for data to be communicated between the computing device 101 and the removable support device 202 in both directions. The transmission and receipt of data may allow, for example, the removable support device 202 to provide an application to the computing device 101 to be executed on the computing device 101 while the computing device 101 is attached to the removable support device 202. In at least one example, the computing device 101 may be attached to a removable support device 202, communicate user identification information to the removable support device 202 upon receipt of which, the removable support device 202 may communicate appropriate permissions or instructions to allow the computing device 101 to access data stored in the removable support device 202.

In other implementations, the communication device 111, 211 may be a passive communication device, such as radio frequency identification (RFID), optical patterns (e.g., barcodes, dot-matrix codes, stripes, colors, other optical patterns visible in or out of the visible spectrum), magnetic switch(es), contact switch(es), passive NFC, or other communication devices that may allow the computing device 101 to detect and/or identify the removable support device 202 without the removable support device 202 having an independent power supply or vice versa. For example, the communication device 111 of the computing device 101 may detect the presence of a passive communication device 211 of the removable support device 202 upon attachment of the computing device 101 to the removable support device 202.

In some implementations, attaching the computing device 101 to a removable support device 202 may effect a response from the computing device 101. For example, attaching the computing device 101 to the removable support device 202 may allow the computing device 101 to detect a communication device 211 of the removable support device 202. Upon detecting the removable support device 202, the computing device may open an application or change operating modes appropriate for use with the removable support device 202. For example, a computing device 101 may detect a removable support device 202 associated with a home automation system (e.g., a removable support device 202 positioned on a wall of a home) and open heating, ventilation, and air conditioning (HVAC) control software.

In other examples, the computing device may detect removal from a removable support device 202 and change operating conditions. For example, a computing device used in a parcel delivery vehicle may provide driving directions to a delivery location while attached to a removable support device 202 in the parcel delivery vehicle. Upon detachment from the removable support device 202 in the parcel delivery vehicle, the computing device 101 may automatically switch applications to a signature collection application for delivery confirmation from the parcel recipient. The computing device 101 may return to a navigation mode when reattached to the removable support device 202 in the parcel delivery vehicle.

In some implementations, attaching or detaching the computing device 101 and the removable support device 202 at the interface surface 110, 230 may alter at least one property or parameter of the computing device 101 and/or removable support device 202 including but not limited to the user interface, microphone state, opening/closing (including maximizing/minimizing) programs or applications, power consumption, screen brightness, display information/configuration, lock state, camera state, activation of one or more communication devices, global positioning antenna/transceiver, or other parameters.

In at least one example, the communication between the computing device 101 and the removable support device 202 may be at least partially dependent upon the orientation of the computing device 101 and removable support device 202 at the interface surface 110 and complementary interface surface 230. The one or more attachment features 120, 240 may provide a predetermined orientation of the computing device 101 and removable support device 202 when in an attached state.

Figure 4:
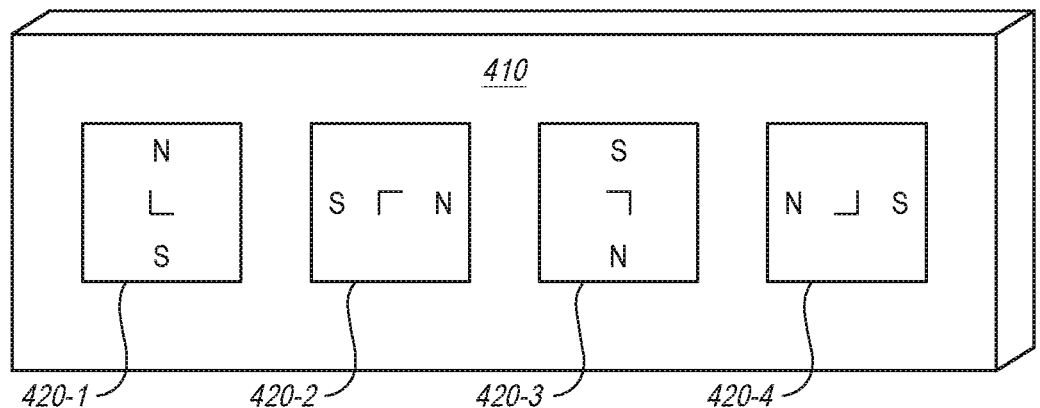
FIG. 4 is a perspective view of an implementation of an interface surface with one or more attachment features.

FIG. 4 is a perspective view of an implementation of an interface surface 410 with one or more attachment features 420. Although FIG. 4 illustrates an interface surface schematically, the interface surface 410 may be used on a computing device, such as computing device 101 or any other computing device described herein.

The interface surface 410 may include one or more attachment features 420-1, 420-2, 420-3, 420-4. As shown, the interface surface 410 includes four attachment features 420-1, 420-2, 420-3, 420-4. In other implementations, the interface surface 410 may include more or fewer attachment features. In implementations with two or more attachment features 420-1, 420-2, 420-3, 420-4, the attachment features 420-1, 420-2, 420-3, 420-4 may be aligned with respect to each other. As shown, the four attachment features 420-1, 420-2, 420-3, 420-4 are aligned through (e.g., parallel about) their horizontal axes.

As shown, the attachment features 420-1, 420-2, 420-3, 420-4 may be magnetic. The magnetic attachment features 420-1, 420-2, 420-3, 420-4 may have a polarity (i.e., direction of the magnetic field) that may be in-plane with the interface surface 410. The poles of the magnets are indicated with an "N" (North) and an "S" (South). In some implementations, an interface surface 410 may include a magnetic attachment feature 420-1, 420-2, 420-3, 420-4 having an in-plane polarity to provide a predetermined orientation to the connection between the interface surface 410 and an interface surface of a support device (such as the interface surface 230 described in relation to FIG. 2).

In other implementations, an interface surface 410 may include a plurality of magnetic attachment features 420-1, 420-2, 420-3, 420-4 that may each provide a particular orientation and/or relationship with an interface surface of a support device. When positioned in concert with one another, the plurality of magnetic attachment features 420-1, 420-2, 420-3, 420-4 may provide a unique series of magnetic field orientations to which a support device may have a complementary set of magnetic attachment features in order to be able to attach. A device lacking the appropriate series of complementary magnetic field orientations may be unable to attach.

The first attachment feature 420-1 and the second attachment feature 420-2 may be oriented with respect to each other. As shown, the north and south poles of the first attachment feature 420-1 may be aligned with respect to the north and south poles of the second attachment feature 420-2. As shown, the north and south poles of the second attachment feature 420-2 are rotated ninety degrees with respect to the north and south poles of the first attachment feature 420-1, the north and south poles of the third attachment feature 420-3 are rotated one hundred and eighty degrees with respect to the north and south poles of the first attachment feature 420-1, and the north and south poles of the fourth attachment feature 420-4 are rotated two hundred and seventy degrees with respect to the north and south poles of the first attachment feature 430-1. In other implementations, the attachment features 430 may be otherwise oriented.

Figures 1, 5:
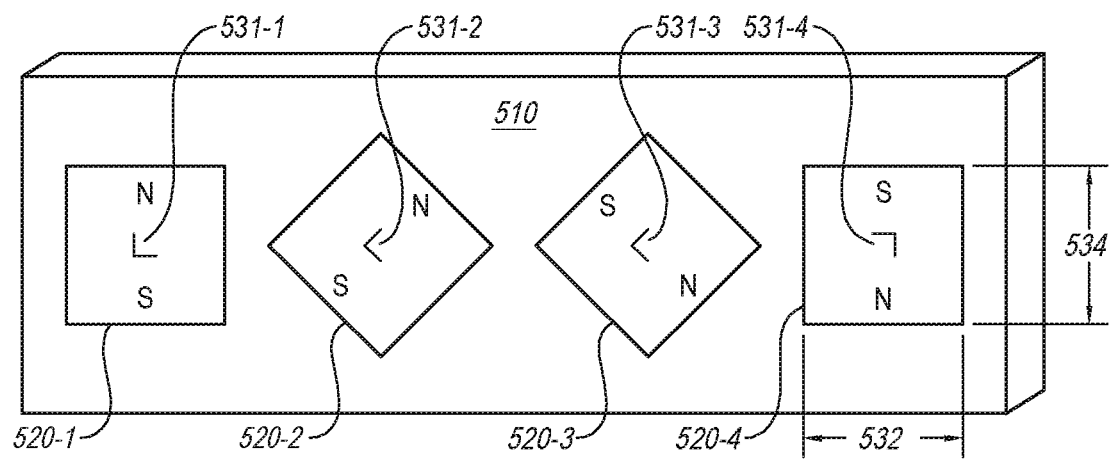
Figures 2, 5:
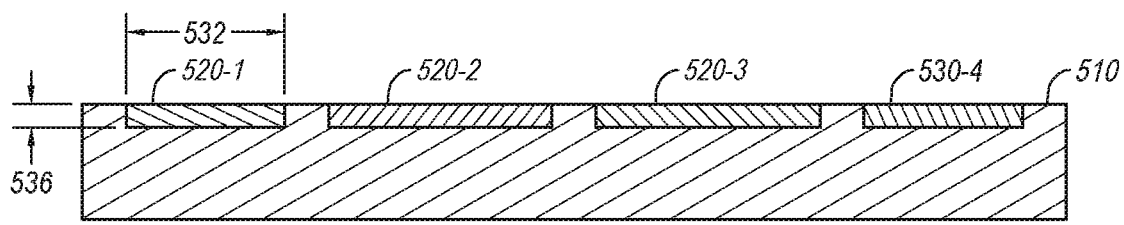

For example, FIG. 5-1 is a perspective view of an implementation of an interface surface 510 with one or more attachment features 520-1, 520-2, 520-3, 520-4. The first attachment feature 520-1 is oriented at a first angle 531-1, the second attachment feature 520-2 is oriented at a second angle 531-2, the third attachment feature 520-3 is oriented at a third angle 531-3, and the fourth attachment feature 520-4 is oriented at a fourth angle 531-4. The difference between the first angle 531-1 and the second angle 531-2 is shown as forty-five degrees.

Two or more of the attachment features 520-1, 520-2, 520-3, 520-4 may be aligned along one or more sides while the north and south poles may not be aligned. For example, as shown, two sides of the first attachment feature 520-1 may be aligned with two sides of the fourth attachment feature 520-4 while the first angle 531-1 and the fourth angle 531-4 orient the north and south poles of the magnets at a one-hundred-and-eighty-degree angle. In other implementations, at least one of the magnetic attachment features may be oriented with a polarity in-plane with the interface surface 510, and at least one other magnetic attachment feature may be oriented with a polarity at least partially out of the plane of the interface surface 510. For example, at least one of the magnetic attachment features may be oriented with a magnetic field oriented normal to the interface surface 510.

FIG. 5-2 is a cross-sectional side view of the implementation of an interface surface 510 of FIG. 5-1. The attachment features 520-1, 520-2, 520-3, 520-4 may have one or more major dimensions. As shown in FIGS. 5-1 and 5-2, the attachment features 520-1, 520-2, 520-3, 520-4 may have a width 532 (shown in FIGS. 5-1 illustrating the width of the fourth attachment feature 520-4 and in FIG. 5-2 illustrating the width of the first attachment feature 520-1), a height 534 (shown in FIG. 5-1), and a thickness 536 (shown in FIG. 5-2).

The major dimensions and/or the material of a magnetic attachment feature may determine the strength of a magnet. For example, the larger the major dimensions and/or the more magnetic the material, the stronger the magnet. In some implementations, one or more of the magnets may impart a force in a range having an upper value, a lower value, or upper and lower values including any of 1.0 Newton (N), 2.0 N, 3.0 N, 4.0 N, 5.0 N, 7.5 N, 10.0 N, 12.5 N, 15.0 N, 17.5 N, 20.0 N, or any values therebetween. For example, at least one of the magnets may impart a force greater than 1.0 N. In other examples, at least one of the magnets may impart a force less than 20.0 N. In yet other examples, at least one of the magnets may impart a force between 1.0 N and 20.0 N. In at least one example, at least one of the magnets may impart a force of 5.25 N.

In some implementations, a magnetic attachment feature of the computing device may provide a magnetic field of the same magnitude as a magnetic attachment feature of the support device. In other implementations, a magnetic attachment feature of the computing device may provide a magnetic field of greater magnitude than a magnetic attachment feature of the support device. For example, the magnetic attachment feature of the computing device may provide a magnetic field with a magnitude at least twice as large as the magnetic attachment feature of the support device. In other examples, the magnetic attachment feature of the computing device may provide a magnetic field with a magnitude at least three times as large as the magnetic attachment feature of the support device. In yet other examples, the magnetic attachment feature of the computing device may provide a magnetic field with a magnitude at least four times as large as the magnetic attachment feature of the support device. In yet other implementations, a magnetic attachment feature of the computing device may provide a magnetic field of lesser magnitude than a magnetic attachment feature of the support device. For example, the magnetic attachment feature of the support device may provide a magnetic field with a magnitude at least twice as large as the magnetic attachment feature of the computing device. In other examples, the magnetic attachment feature of the support device may provide a magnetic field with a magnitude at least three times as large as the magnetic attachment feature of the computing device. In yet other examples, the magnetic attachment feature of the support device may provide a magnetic field with a magnitude at least four times as large as the magnetic attachment feature of the computing device.

Figure 6:
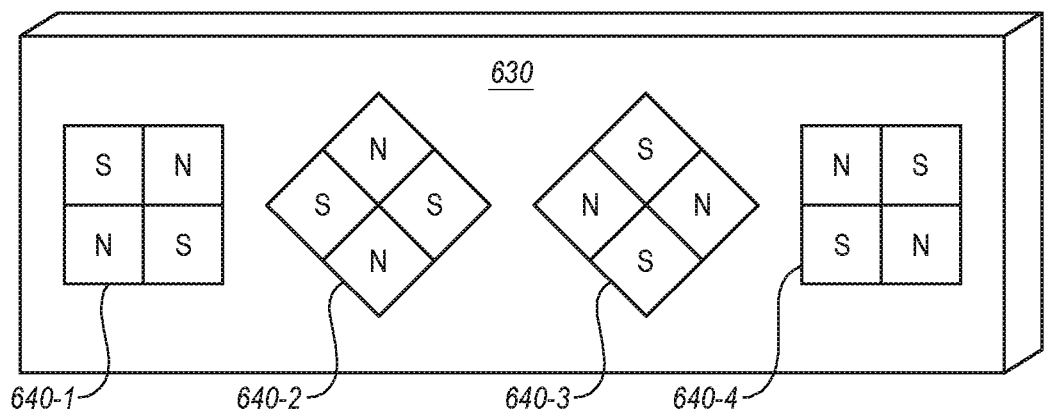
FIG. 6 is a perspective view of an implementation of a removable support device attachment interface.

FIG. 6 is a perspective view of an implementation of an interface surface 630 with a plurality of attachment features 640-1, 640-2, 640-3, 640-4. The interface surface 630 and/or the plurality of attachment features 640-1, 640-2, 640-3, 640-4 may be similar to the interface surface and/or one or more attachment features described above. At least one of the plurality of attachment features 640-1, 640-2, 640-3, 640-4 may include a plurality of magnets with a polarization normal to the interface surface 630. In some implementations, the plurality of magnets in an attachment feature 640-1 may produce a magnetic field having field lines with an orientation in the plane of the interface surface 630. For example, the first attachment feature 640-1 may contain a plurality of magnets such that the first attachment feature has more than one north and south pole pair on the interface surface 630, as shown, similar to a single magnet with a N and S pole in the interface surface (such as shown in FIGS. 5-1 and 5-2). While the implementation illustrated in FIG. 6 includes a plurality of magnets in each of the attachment features 640-1, 640-2, 640-3, 640-4, in other implementations, at least one of the attachment features may have only one magnet with a single pair of magnetic poles.

Figure 7:
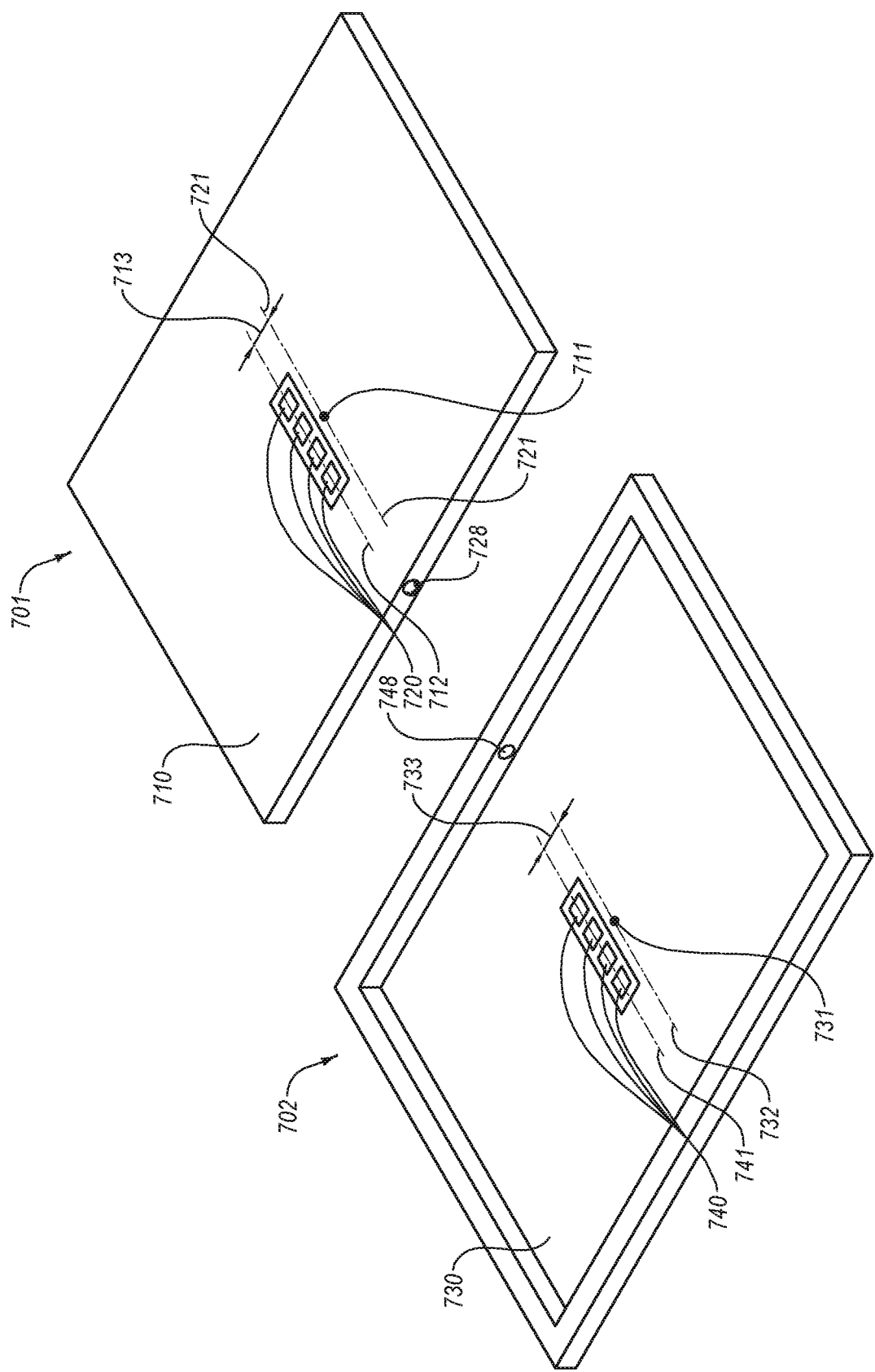
FIG. 7 is a perspective view of an implementation of a support system.

FIG. 7 is a perspective view of an implementation of a support system including a computing device 701 and a removable support device 702. The computing device 701 and/or elements thereof may be similar to the other computing devices and/or components of computing devices disclosed herein. Similarly, the removable support device 702 and/or elements thereof may be similar to the other removable support devices and/or components of removable support devices disclosed herein.

The computing device 701 includes an interface surface 710 with one or more attachment features 720. The one or more attachment features 720 may be oriented relative to the interface surface 710. For example, the interface surface 710 may include a midpoint 711 and/or a horizontal axis 712. A horizontal axis 721 of the one or more attachment features 720 may be offset from the midpoint 711 and/or horizontal axis 712 of the interface surface 710. The offset may be measured by a distance 713 between the midpoint 711 and/or horizontal axis 712 of the interface surface 710 and the horizontal axis 721 of the one or more attachment features 720.

The removable support device 702 includes an interface surface 730 with one or more attachment features 740. The one or more attachment features 740 may be oriented relative to the interface surface 730. For example, the interface surface 730 may include a midpoint 731 and/or a horizontal axis 732. A horizontal axis 741 of the one or more attachment features 740 may be offset from the midpoint 731 and/or horizontal axis 732 of the interface surface 730.

The offset may be measured by a distance 733 between the midpoint 731 and/or horizontal axis 732 of the interface surface 730 and the horizontal axis 741 of the one or more attachment features 740. The distances 713, 733 may be the same such that the computing device 701 may be inserted into the pocket (not labeled) of the removable support device 702.

As shown in FIG. 7, the computing device 701 and the removable support device 702 include both magnetic attachment features 720, 740 and a mechanical interlock feature 728, 748. In other implementations, the computing device 701 and/or the removable support device 702 may include only magnetic attachment features 720, 740 or only mechanical interlock features 728, 748. Although a detent 728 is shown as the mechanical interlock feature 728, the mechanical interlock feature 728 may include one or more of a snap feature, a detent feature, a solenoid actuated lock feature, a shape memory alloy actuated lock feature, a self-locking taper feature, a compressible interference feature, a pressure sensitive adhesive, channels (one or more of a bottom channel, one or more side channels, one or more corner channels, and a top channel) into which the computing device 701 may slide to limit movement in at least one direction (e.g., toward the ground, out of plane, laterally), and micro-suction tape.

Figure 8:
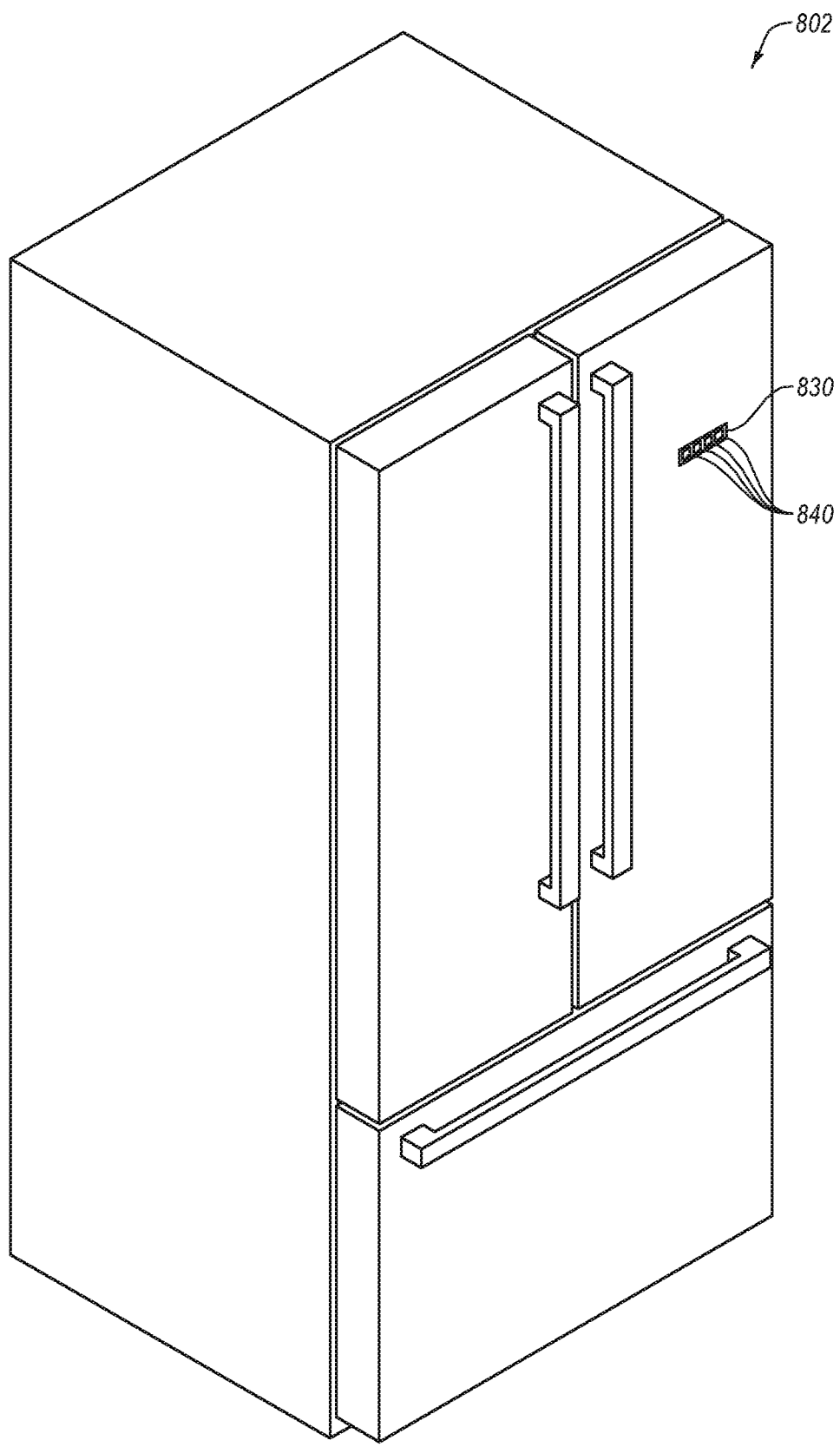
FIG. 8 is a perspective view of an implementation of a removable support device on an appliance.

FIG. 8 is a perspective view of an implementation of a removable support device 802 on an appliance. For example, the removable support device 802 may be a refrigerator, a washer and/or dryer, a freezer, a dishwasher, other household appliance, a vending machine, a furnace, a point-of-sale machine, a forklift, other commercial appliance, or other appliances. The removable support device 802 may include an interface surface 830 and one or more attachment features 840 to support and orient the computing device on the removable support device 802. The interface surface 830 and/or one or more attachment features 840 may be similar to one or more interface surfaces and/or attachment features described herein.

The removable support device 802 may be connected to a computing device, such as one or more of the computing devices described herein. As described herein, removable support device 802 may allow for data communication with the computing device when a computing device is attached to the interface surface 830. For example, a computing device may communicate with a refrigerator to transmit ice-making instructions to the refrigerator. In other examples, the refrigerator may transmit data to the computing device regarding contents of the refrigerator. In yet other examples, a removable support device 802 may communicate with the computing device to troubleshoot and/or diagnose errors with the removable support device 802. In at least one example, a removable support device 802 may transmit an operating manual to the computing device.

Figure 9:
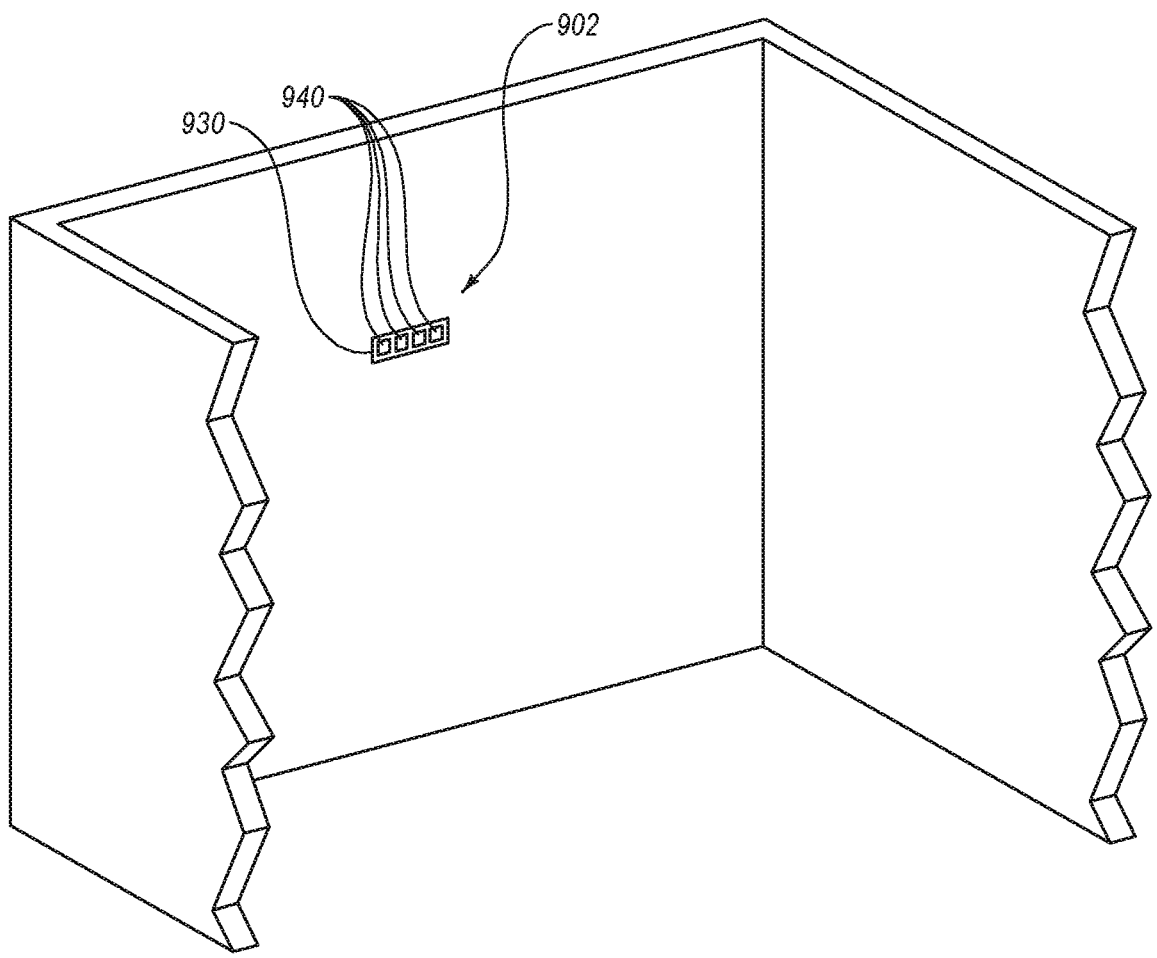
FIG. 9 is a perspective view of an implementation of a removable support device on a structure.

FIG. 9 is a perspective view of an implementation of a removable support device 902 on a structure (e.g., a wall). The removable support device 902 may include an interface surface 930 and one or more attachment features 940. The interface surface 930 and/or one or more attachment features 940 may be similar to one or more interface surfaces and/or attachment features described herein. The removable support device 902 may be connected to a computing device, such as one or more of the computing devices described herein. In some implementations, the removable support device 902 may include a wireless charging device (e.g., an inductive charging device) positioned in the interface surface 930. For example, a computing device may be positioned proximate the interface surface 930 and the one or more attachment features 940 may magnetically attract one or more attachment features of the computing device. The interaction of the one or more attachment features of the removable support device 902 and the computing device may magnetically attach and orient the computing device such that the computing device may be wirelessly charged and/or powered.

Figure 10:
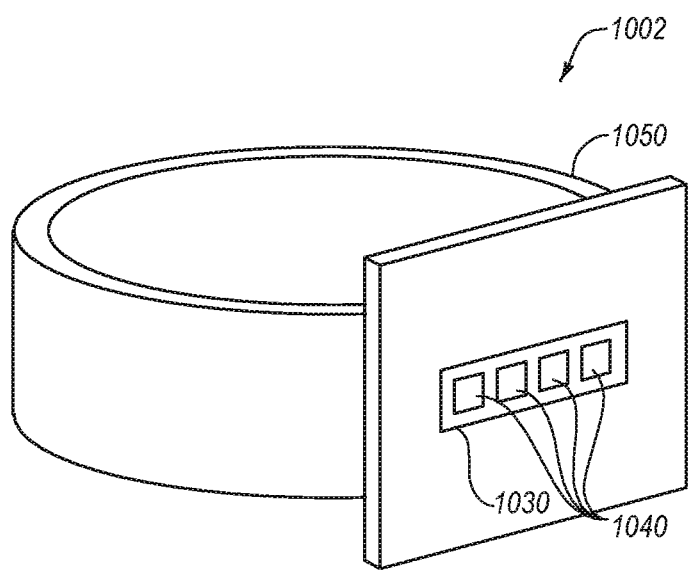
FIG. 10 is a perspective view of an implementation of a wearable removable support device.

FIG. 10 is a perspective view of an implementation of a wearable removable support device 1002 such as a wristband for smartwatch usage, an armband for exercise usage, a headband for hands-free visual display, a chestband for vital bodily information monitoring, or other wearable removable support devices. The removable support device 1002 may include an interface surface 1030 and one or more attachment features 1040. The interface surface 1030 and/or one or more attachment features 1040 may be similar to one or more interface surfaces and/or attachment features described herein. The removable support device 1002 may include a wearable strap 1050 for affixing the removable support device 1002 to a user. The removable support device 1002 may be connected to a computing device, such as one or more of the computing devices described herein. Thus, a user may support a computing device hands-free.

Figure 11:
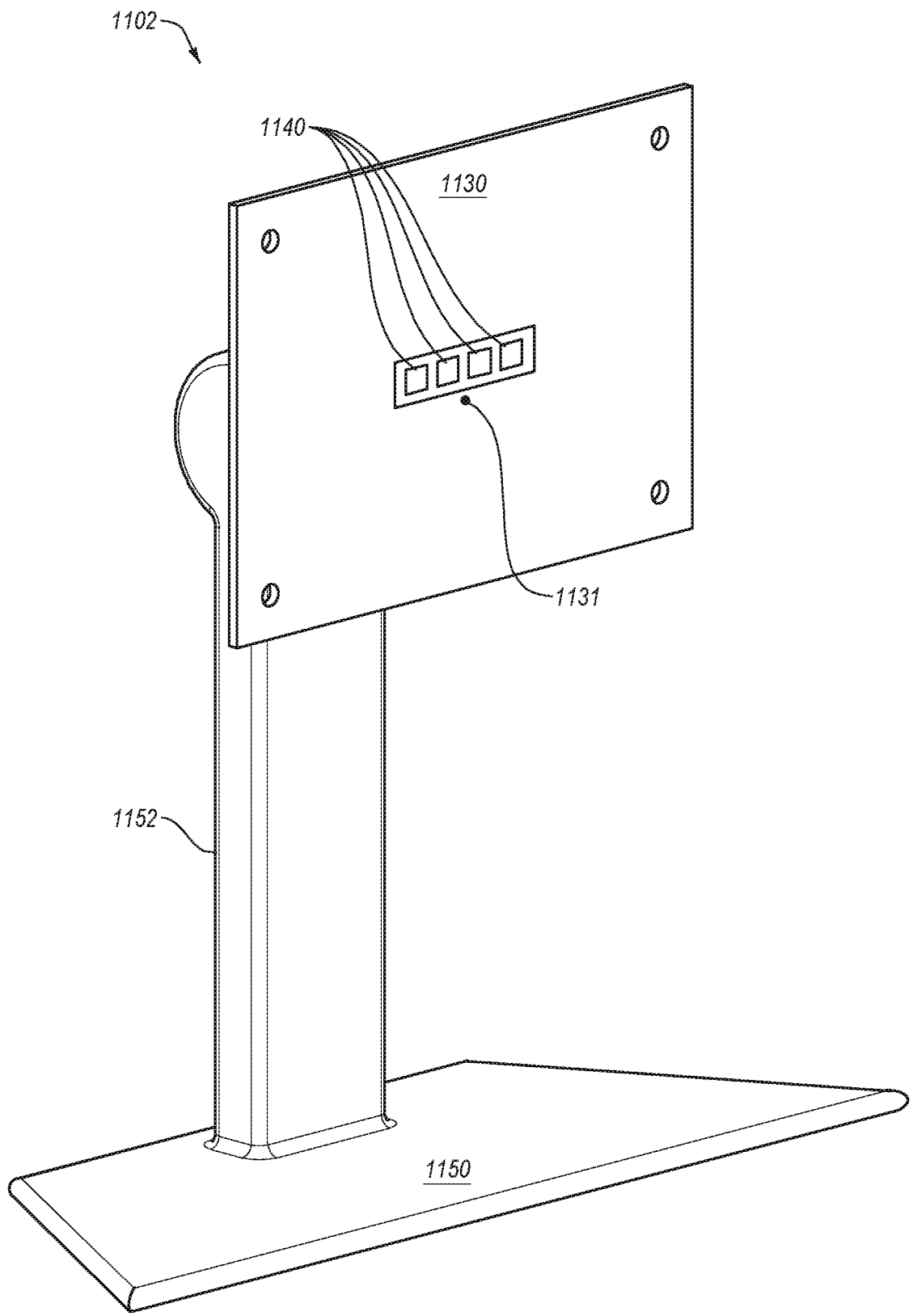
FIG. 11 is a front perspective view of an implementation of a removable support device.
Figure 12:
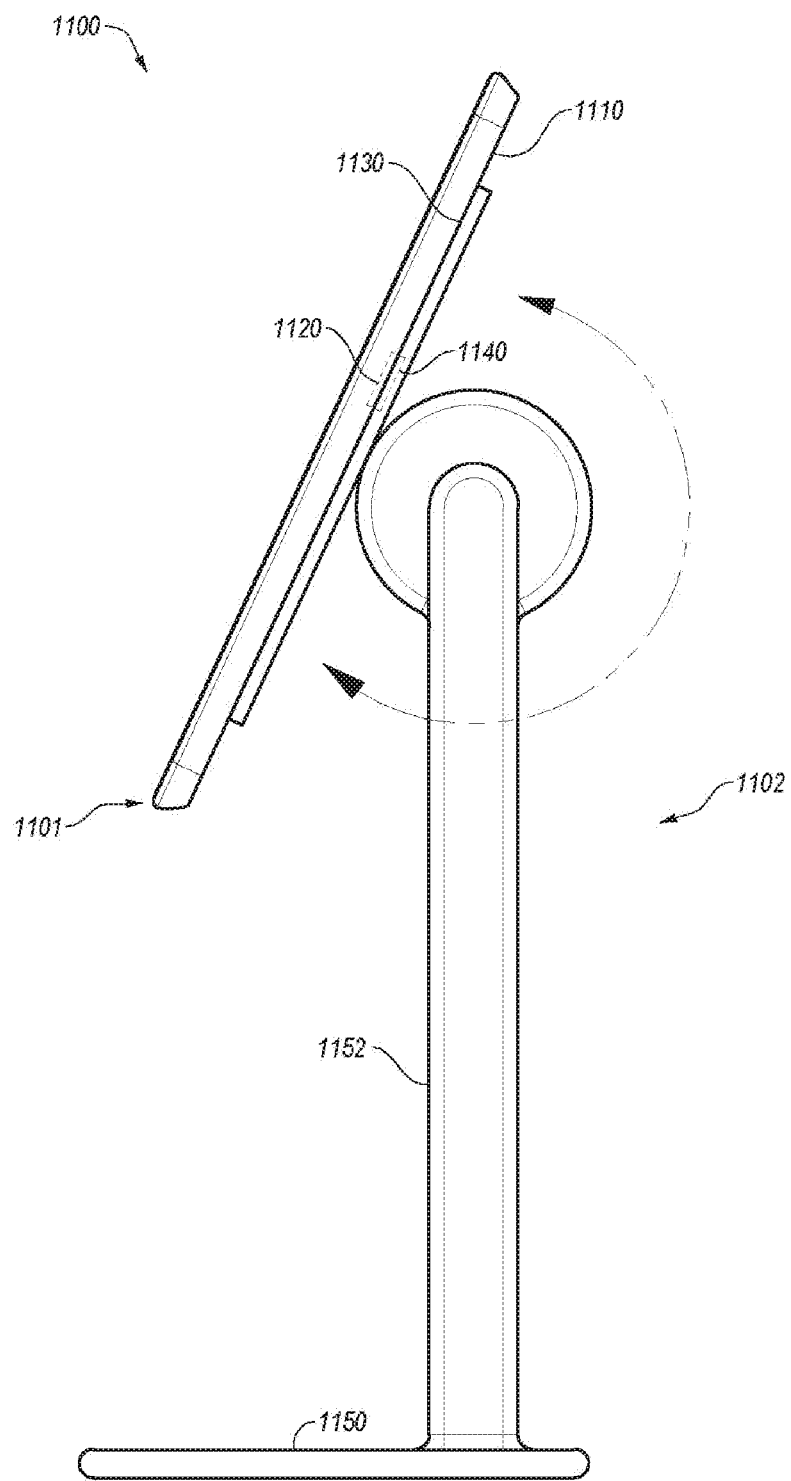
FIG. 12 is a side view of the implementation of a removable support device of FIG. 11 with an implementation of a computing device.

FIGS. 11 and 12 illustrate an implementation of a support system 1100 including a removable support device 1102 for counter, tabletop, or desktop use. FIG. 11 is a front perspective view of the removable support device 1102. The removable support device 1102 may include an interface surface 1130 and one or more attachment features 1140. The interface surface 1130 and/or one or more attachment features 1140 may be similar to one or more interface surfaces and/or attachment features described herein. The removable support device 1102 may be connected to a computing device, such as one or more of the computing devices described herein.

The removable support device 1102 is shown with a midpoint 1131. The interface surface 1130 may be oriented relative to the midpoint 1131. The interface surface 1130 may be supported by a base 1150 and a support member 1152. The position of the interface surface 1130 may be adjusted relative to the support member 1152 and/or base 1150 as shown in FIG. 12, a side view of the implementation of a removable support device 1102 of FIG. 11 with an implementation of a computing device 1101. For example, the interface surface 1130 and/or the computing device 1101 may be pivoted about the support member 1152 as shown.

The computing device 1101 may include an interface surface 1110 and one or more attachment features 1120. The one or more interface surfaces 1110, 1130 of the computing device 1101 and the removable support device 1102 may abut in an attached state.

Figures 1, 13:
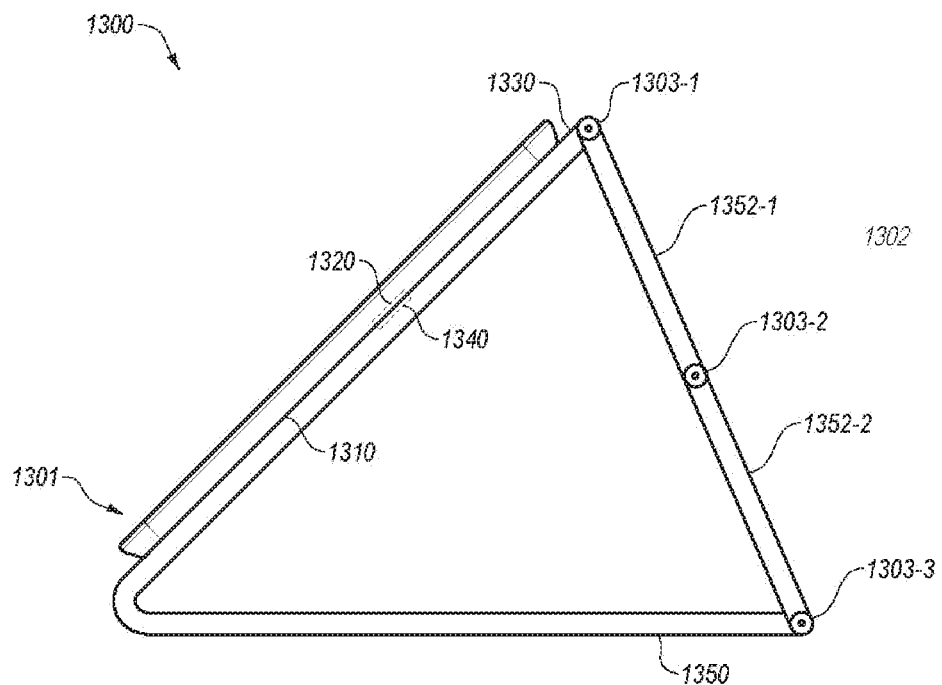
Figures 2, 13:
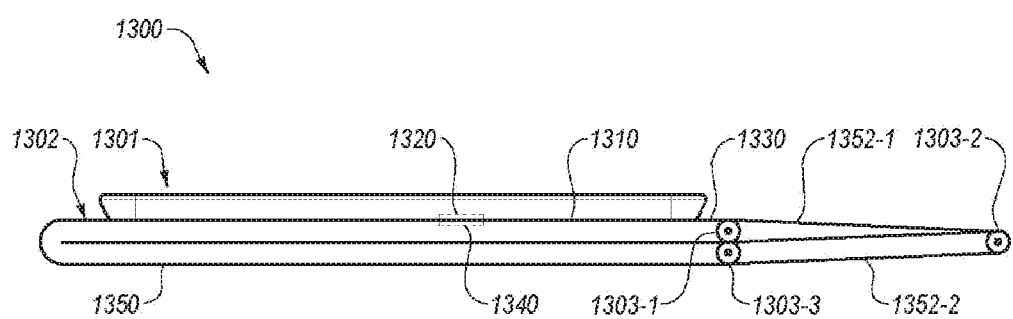

FIG. 13-1 is a side view of an implementation of a support system 1300 in an open configuration and FIG. 13-2 is a side view in a closed configuration. The support system 1300 includes a computing device 1301 and a removable support device 1302. The computing device 1301 includes an interface surface 1310 and one or more attachment features 1320. The removable support device 1302 includes an interface surface 1330 and one or more attachment features 1340. The removable support device 1302 includes a foldable base 1350. The foldable base 1350 may include a plurality of hinges 1303-1, 1303-2, 1303-3. The hinges 1303 may be separated by one or more support members 1352-1, 1352-2. The hinges 1303 and/or support members 1352 may facilitate transitioning between the open and closed configurations of FIGS. 13-1 and 13-2.

In some implementations, the removable support device 1302 may communicate with the computing device 1301 and/or alter at least one property and/or operating parameter of the computing device 1301 upon attaching the computing device 1301 to the removable support device 1302. In other implementations, the removable support device 1302 may communicate with the computing device 1301 differently in the open configuration of FIG. 13-1 and the closed configuration of FIG. 13-2. For example, attaching the computing device 1301 to the removable support device 1302 in an open configuration may default the computing device 1301 to a "display mode", while attaching the computing device 1301 to the removable support device 1302 in a closed configuration may default the computing device 1301 to a "drawing mode" (e.g., for use with a stylus).

Figures 1, 14:
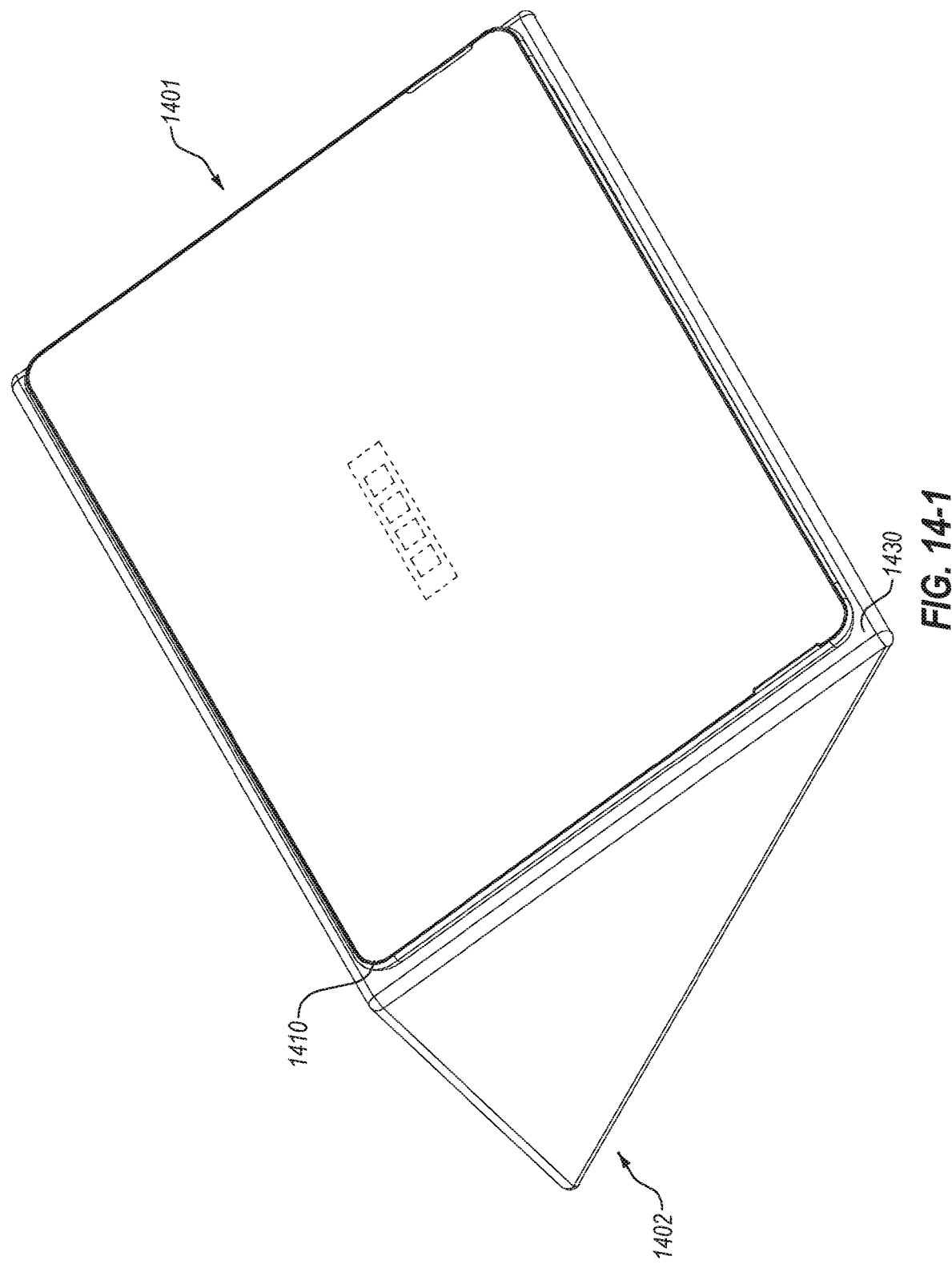
Figures 3, 14:
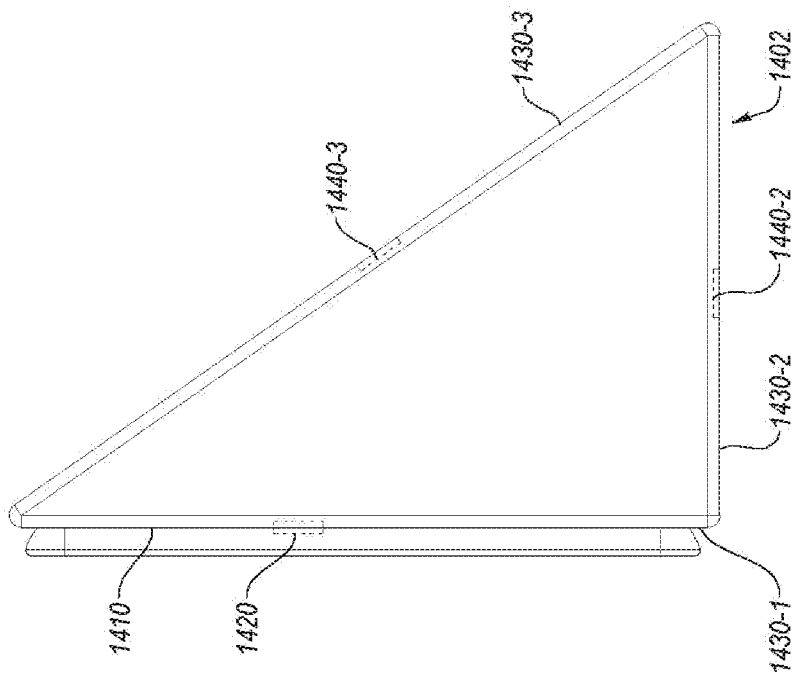
Figures 2, 14:
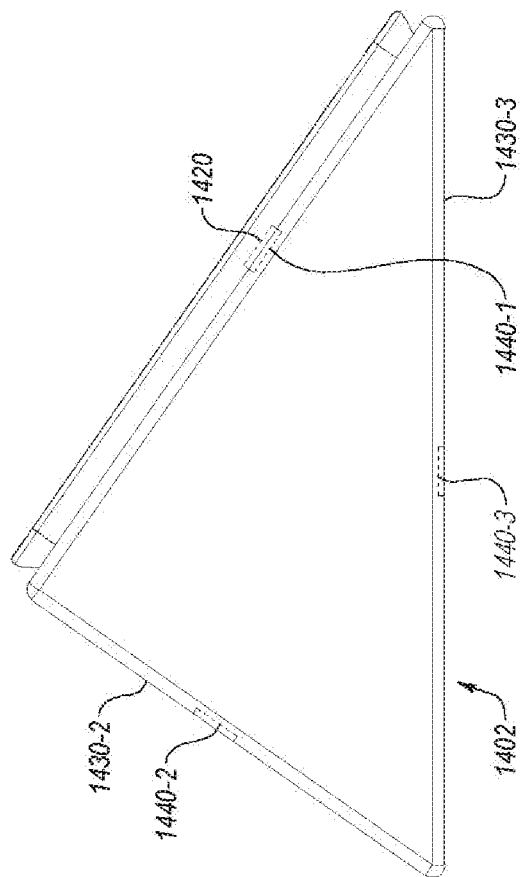

FIGS. 14-1 through 14-3 illustrate an implementation of a support system with a computing device 1401 and a removable support device 1402 with a fixed geometry. FIGS. 14-1 and 14-2 illustrate the support system 1400 in a first position and FIG. 14-3 illustrates the support system 1400 in a second position. A third position, in the present implementation, or more or fewer positions, in other implementations, are also contemplated.

The computing device 1401 includes an interface surface 1410 and one or more attachment features 1420. The removable support device 1402 includes a plurality of interface surfaces 1430-1, 1430-2, 1430-3 and a plurality of attachment features 1440-1, 1440-2, 1440-3. The plurality of attachment features 1440-1, 1440-2, 1440-3 may be positioned relative to the plurality of interface surfaces 1430-1, 1430-2, 1430-3.

Figure 15:
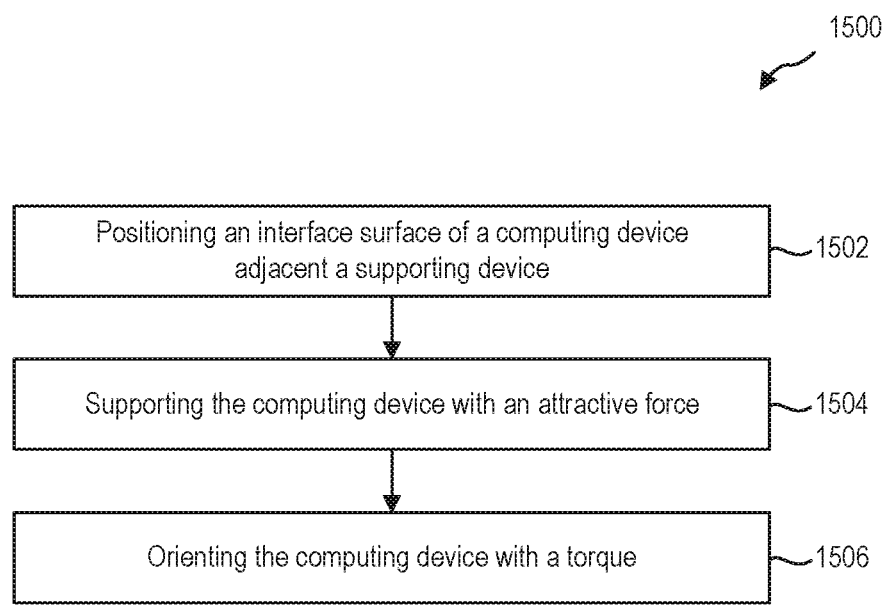
FIG. 15 is a flowchart of an implementation of a method of attaching and orienting a computing device on a removable support device.

FIG. 15 is a flowchart illustrating an implementation of a method 1500 of attaching and/or orienting a computing device on a removable support device. The method 1500 may include positioning an interface surface of a computing device adjacent an interface surface of a support device at 1502. The method 1500 may further include supporting the computing device with an attractive force between the at least one attachment feature of the computing device and at least one attachment feature of the support device at 1504. In some implementations, the attractive force may be a magnetic force. In other implementations, the attractive force may be a mechanical compressive force. The method 1500 may include orienting the computing device relative to the support device with a torque applied by at least one attachment feature of the computing device and at least one attachment feature of the support device at 1506. In some implementations, at least a portion of the attractive force and at least a portion of the torque may be applied by the same attachment feature.

In some implementations, orienting the computing device relative to the support device may orient the computing device on the interface surface of the support device at a predetermined orientation. For example, orienting the computing device relative to the support device may align one or more components of the computing device and support device to facilitate communication between the computing device and support device. In at least one example, the computing device may detect or communicate with a passive communication device of the support member when aligned with the support member at the predetermined orientation.

At least some implementations of the present disclosure may allow a user to selectively attach and detach a computing device from a support device. The interface surface having a sequence of magnetic fields oriented relative to one another may allow for a computing device to be held securely on a support device at a predetermined orientation. The predetermined orientation may enable additional functionality, such as data communication or wireless charging, and may improve the reliability and aesthetics of the system.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one implementation" or "an implementation" of the present disclosure are not intended to be interpreted as excluding the existence of additional implementations that also incorporate the recited features. For example, any element described in relation to an implementation herein may be combinable with any element of any other implementation described herein. Numbers, percentages, ratios, or other values stated herein are intended to include that value, and also other values that are "about" or "approximately" the stated value, as would be appreciated by one of ordinary skill in the art encompassed by implementations of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to implementations disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the implementations that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described implementations are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A computing device comprising:
an interface surface having a base plane; and
one or more attachment features including a plurality of magnets affixed on the interface surface, the plurality of magnets being polarized in a magnetic plane of the interface surface, wherein the magnetic plane is parallel to the base plane of the interface surface, wherein poles of a first magnet of the plurality of magnets are oriented at a first angle of 45 degrees to poles of a second magnet of the plurality of magnets, a third magnet of the plurality of magnets magnetically adjacent to the second magnet of the plurality of magnets, wherein poles of the third magnet of the plurality of magnets are oriented at a second angle of 135 degrees to poles of the first magnet of the plurality of magnets.

2. The computing device of claim 1, wherein the plurality of magnets vary in magnetic field orientation with respect to each other.

3. The computing device of claim 1, a fourth magnet of the plurality of magnets, wherein poles of the fourth magnet of the plurality of magnets are oriented at a third angle of 180 degrees to poles of the first magnet of the plurality of magnets.

4. The computing device of claim 1, wherein the first magnet of the plurality of magnets, the second magnet of the plurality of magnets, and the third magnet of the plurality of magnets are arranged in a row.

5. The computing device of claim 4, wherein the first magnet of the plurality of magnets, the second magnet of the plurality of magnets, and the third magnet of the plurality of magnets are aligned about their respective horizontal axes.

6. The computing device of claim 1, wherein the plurality of magnets the first magnet of the plurality of magnets, the second magnet of the plurality of magnets, and the third magnet of the plurality of magnets are horizontally spaced apart.

7. The computing device of claim 1, wherein the plurality of magnets are located at or near a midpoint of the computing device.

8. The computing device of claim 1, wherein the plurality of magnets impart a force of greater than 1 Newton.

9. The computing device of claim 1, wherein a mechanical interlock feature includes one or more of a snap feature, a detent feature, a solenoid actuated lock feature, a shape memory alloy actuated lock feature, a self-locking taper feature, a compressible interference feature, a pressure sensitive adhesive, a channel into which the computing device may slide, and micro-suction tape.

10. The computing device of claim 1, wherein an outer surface of one or more of the plurality of attachment features is flush with the interface surface.

11. A system for supporting a computing device, the system comprising:
a computing device, the computing device including:
an interface surface, and
at least one attachment feature affixed on the interface surface, the at least one attachment feature including a first magnetic field polarized in a plane of the interface surface; and
a removable support device configured to support the computing device, the removable support device including:
a complementary interface surface; and
at least one complementary attachment feature positioned on the complementary interface surface, the complementary attachment feature including a second magnetic field being polarized in a plane of the complementary interface surface such that the attachment feature and complementary attachment feature apply a torque between the computing device and support device to orient the computing device and support device to a predetermined orientation, the second magnetic field having a second magnetic field magnitude, and wherein one or more of the first magnetic field or the second magnetic field are generated by:
a first magnet and a second magnet, wherein poles of the first magnet are oriented at a first angle of 45 degrees to poles of the second magnet and
a third magnet magnetically adjacent to the second magnet, wherein poles of the third magnet are oriented at a second angle of 135 degrees to poles of the first magnet.

12. The system of claim 11, wherein the removable support device includes a communication device.

13. The system of claim 12, wherein the communication device of the removable support device is a passive communication device.

14. The system of claim 11, wherein the removable support device is a wearable support device.

15. The system of claim 11, wherein the removable support device is an appliance.

16. The system of claim 11, wherein the first magnetic field magnitude is at least twice as large as the second magnetic field magnitude.

17. The system of claim 11, wherein the first magnetic field magnitude is at least twice as different from the second magnitude when the computing device and the removable support device abut.

18. A method of supporting a computing device, the method comprising:
positioning an affixed interface surface of the computing device adjacent an affixed complementary interface surface of a support device;
supporting the computing device with an attractive force between the computing device and the support device, the attractive force being sufficient to hold the computing device relative to the support device without the interface surface and complementary interface surface translating relative to one another; and orienting the computing device relative to the support device with a torque from magnetic forces of a first magnet positioned in the interface surface and a second magnet positioned in the complementary interface surface, wherein one or more of the first magnetic field or the second magnetic field are generated by:
   a first magnet and a second magnet, wherein poles of the first magnet are oriented at a first angle of 45 degrees to poles of the second magnet and
   a third magnet magnetically adjacent to the second magnet, wherein poles of the third magnet are oriented at a second angle of 135 degrees to poles of the first magnet.

19. The method of claim 18, wherein orienting the computing device relative to the support device facilitates data communication between the computing device and support device.

20. The method of claim 18, wherein a first magnetic force of the first magnet is at least twice different a second magnetic force of the second magnet when the computing device and the support device are physically connected.

* * * * *